United States Patent [19]

Berg

[11] Patent Number: 4,758,927

[45] Date of Patent: Jul. 19, 1988

[54] METHOD OF MOUNTING A SUBSTRATE STRUCTURE TO A CIRCUIT BOARD

[75] Inventor: William E. Berg, Portland, Oreg.

[73] Assignee: Tektronix, Inc., Beaverton, Oreg.

[21] Appl. No.: 5,703

[22] Filed: Jan. 21, 1987

[51] Int. Cl.⁴ .......................... H05K 1/18; H05K 3/08
[52] U.S. Cl. ...................................... 361/401; 29/827;
29/834; 361/388; 361/406
[58] Field of Search .................. 29/827, 832, 834, 840;
174/52 FP; 357/70, 79, 81, 82, 74; 361/403,
406, 382, 383, 385, 386, 388

[56] References Cited

U.S. PATENT DOCUMENTS

| | | | |
|---|---|---|---|
| 3,469,684 | 9/1969 | Keady et al. | 29/827 X |
| 3,872,583 | 3/1975 | Beall et al. | 29/827 |
| 4,255,003 | 3/1981 | Berg | 439/71 |
| 4,390,220 | 6/1983 | Benasutti | 174/52 FP |
| 4,639,829 | 1/1987 | Ostergren et al. | 361/386 |
| 4,658,330 | 4/1987 | Berg | 361/403 X |
| 4,658,331 | 4/1987 | Berg | 361/403 X |
| 4,688,147 | 8/1987 | Ono | 361/385 |

FOREIGN PATENT DOCUMENTS 56364  5/1979  Japan ..................... 357/74

*Primary Examiner*—Mark Rosenbaum
*Assistant Examiner*—Andrew E. Rawlins
*Attorney, Agent, or Firm*—John Smith-Hill; Francis I. Gray

[57] ABSTRACT

A substrate structure having contact pads is mounted to a circuit board which has pads of conductive material exposed at one main face of the board and has registration features which are in predetermined positions relative to the contact pads of the circuit board. The substrate structure is provided with leads which are electrically connected to the contact pads of the substrate structure and project from the substrate structure in cantilever fashion. A registration element has a plate portion and also has registration features which are distributed about the plate portion and are engageable with the registration features of the circuit board, and when so engaged, maintain the registration element against movement parallel to the general plane of the circuit board. The substrate structure is attached to the plate portion of the registration element so that the leads are in predetermined position relative to the registration features of the registration element. The registration features of the registration element are brought into engagement with the registration features of the circuit board, and in this position of the registration element the leads of the substrate structure overlie the contact pads of the circuit board. A clamp member maintains the leads in electrically conductive pressure contact with the contact pads of the circuit board.

7 Claims, 5 Drawing Sheets

METHOD OF MOUNTING A SUBSTRATE STRUCTURE TO A CIRCUIT BOARD

This invention relates to a method of mounting a substrate structure to a circuit board.

BACKGROUND OF THE INVENTION

In order to use an integrated circuit chip, it is necessary to make electrical connection to the integrated circuit incorporated within the chip. These connections are made through contact pads located at one main face (hereinafter called the interconnect face) of the chip. Frequently, it is desired to mount the chip on an etched circuit board (ECB) and to establish electrical connection between the contact pads of the chip and circuit runs of the ECB, so as to connect the integrated circuit to other components mounted on the ECB.

As integrated circuits become more complex, in terms of both number of connections (i.e., the number of contact pads) and density of connections (i.e., the ratio of the number of connections to the area available for the connections), it is increasingly necessary to pay attention to factors other than the ohmic performance of the connections between the chip and the circuit board. For example, one reason for seeking to incorporate integrated circuits in ever smaller chips (and consequently increasing the density of connections) is in order to keep internal path lengths short and avoid degradation of high frequency signals. At high signal frequencies, severe demands are placed on the interconnections between the chip and the circuit board in order to avoid unacceptable degradation of the signal.

One electrical connector that is able to transmit high frequency signals without undue degradation is described in U.S. Pat. No. 4,255,003 issued March 10, 1981. In the case of that connector, the chip is mounted on a ceramic substrate that has conductor runs extending from the contact pads of the chip to the periphery of the substrate. The substrate is fitted in a recess in the circuit board, and the conductor runs at the periphery of the substrate align with corresponding conductor runs on the upper surface of the board. A frame-like pressure pad of elastomer, having conductive fingers on its lower surface, is fitted so that it bridges the gap between the ceramic substrate and the circuit board and the conductive fingers establish connection between the conductor runs of the substrate and the corresponding conductor runs of the circuit board. A frame member is fitted over the pressure pad and is secured to the board, compressing the elastomer so that contact force is provided for maintaining the conductive fingers in contact with the conductor runs. This type of connector has been used successfully with signals at frequencies up to 10 GHz.

It is also known to make connections to a chip mounted on a ceramic substrate by use of a lead frame. The lead frame comprises a sheet of metal having four side regions surrounding a rectangular opening, and discrete leads extending, like teeth of a comb, from the side regions towards the center of the opening. The inner ends of the leads are attached to the contact pads of the substrate, and the leads are then electrically isolated from one another by removing the side regions.

SUMMARY OF THE INVENTION

A substrate structure having contact pads is mounted to a circuit board which has pads of conductive material exposed at one main face of the board by a method which includes providing the circuit board with registration features which are in predetermined positions relative to the contact pads of the circuit board and providing a registration element which has a plate portion and also has registration features which are distributed about the plate portion and are engageable with the registration features of the circuit board and, when so engaged, maintain the registration element against movement parallel to the general plane of the circuit board. The substrate structure is provided with leads which are electrically connected to the contact pads of the substrate structure and project from the substrate structure in cantilever fashion. The substrate structure is attached to the plate portion of the registration element so that the leads are in predetermined positions relative to the registration features of the registration element. The registration features of the registration element are brought into engagement with the registration features of the circuit board, and in this position of the registration element the leads overlie the contact pads of the circuit board. A clamp member maintains the leads in electrically conductive pressure contact with the contact pads of the circuit board.

By use of the present invention, it is possible to provide short and direct connections between a circuit board and an integrated circuit which is mounted on the substrate structure. Such short and direct connections have very good high frequency characteristics.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
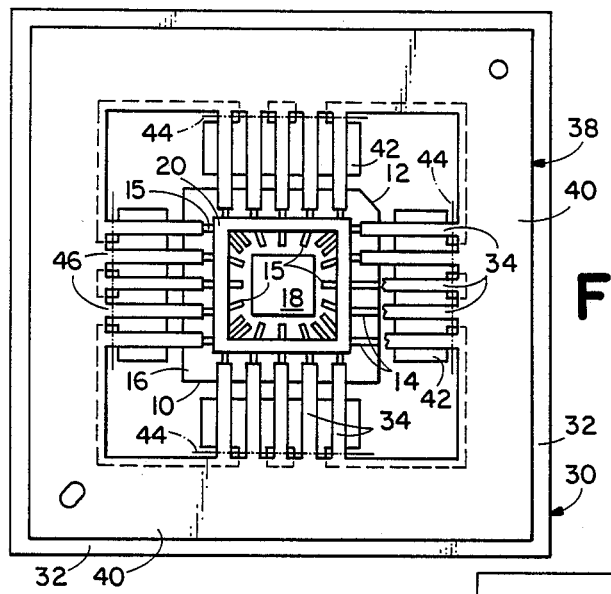
FIG. 1 is a plan view of a ceramic chip carrier having a lead frame attached thereto and a support frame attached to the lead frame.

A chip carrier comprises a ceramic substrate 10, which is generally square in configuration but has one corner 12 cut off as an index marker, and contact pads 14 distributed about the periphery of the upper surface 16 of the substrate. The contact pads are the outer ends of conductor runs 15 that extend over the upper surface 16 from inner ends that are distributed about a die pad 18. A so-called seal ring 20 of dielectric material bounds a rectangular area of the upper surface of the substrate 10. The inner ends of the conductor runs are within that rectangular area.

A lead frame 38 having sides 40 bounding a generally rectangular opening, has leads 34 extending from each side, like teeth of a comb, into the rectangular opening. The center-to-center spacing of the inner ends of the leads 34 is substantially equal to the center-to-center spacing of the contact pads 14 of the chip carrier. The lead frame is made of the metal known as Alloy 42. The inner ends of the leads are brazed to the contact pads of the chip carrier. The lead frame and components electrically connected thereto, for instance the conductor runs 15, are then plated with gold. An integrated circuit chip (not shown) is placed on the die pad 18 in a selected orientation relative to the corner 12 of the chip carrier, its contact pads are connected to the inner ends of the conductor runs 15 by wire bonding, and a lid (not shown in FIG. 1) is attached to the top of the seal ring 20 so as to provide an enclosure for the chip. The assembly of the chip carrier and the lead frame is placed, with the lid down, on a table (not shown). The table has a recess in its upper surface for receiving the lid and the seal ring, so that the lead frame is able to lie flat on the upper surface of the table without being bent.

The lead frame 38 has holes adjacent two opposite corners. One of these holes is circular an the other hole is somewhat elongated. These two holes fit over pins projecting from the upper surface of the table so as to hold the assembly of the chip carrier and the lead frame against movement relative to the table in directions parallel to the upper surface of the table.

A lead frame support 30 is fabricated from a sheet of polyimide. The lead frame support has four sides 32 surrounding a rectangular opening that is about the same size as the opening surrounded by the four sides 40 of the lead frame. Tabs 42 project from the sides 32 respectively of the lead frame support into the opening and are connected to the sides by tongues 46. The lead frame support has a layer of adhesive material, such as that sold under the trademark ULTEM, on its lower surface, and is formed with a circular hole and an elongated slot adjacent two opposite corners. The lead frame support is placed over the assembly of the chip carrier and the lead frame so that the pins projecting from the table (and through the holes in the lead frame) pass through the holes in the lead frame support. The lead frame support is thereby accurately positioned with respect to the lead frame, with the tabs 42 of the lead frame support above the leads 34 and the sides 32 of the lead frame support above the sides 40 of the lead frame. The lower surface of the lead frame support is brought into contact with the upper surface of the lead frame. Heat is applied to the adhesive material, and the adhesive material is cured and bonds the support to the lead frame. After bonding, the four sides of the lead frame and the support are removed, by cutting along the dot-dash line 44, leaving the leads 34 electrically isolated from each other and held in position by the tabs 42. Because of the position of the line 44, the outer ends of the leads 34 project beyond the tabs 42.

The integrated circuit package comprising the ceramic chip carrier 10, the chip itself and the leads 34 attached to the contact pads of the chip carrier is then placed on a lead alignment fixture 50 with the lid down. The fixture 50 is a flat plate having pins 52 projecting from its upper surface. The pins 52 are positioned for edge contact with the outer ends of the leads 34 and define a unique position for the package on the upper surface of the plate. The pins 52 are in predetermined positions relative to a pair of locating posts 54.

A registration aid is fabricated by punching a generally cruciform blank 62 from a sheet of aluminum. The blank has a rectangular portion 64 and arms 66 extending radially from the corners of the rectangular portion. The blank is embossed so that the outer ends of the arms are displaced and lie in a common plane that is generally parallel to and spaced from the general plane of the rectangular portion, and holes 68a . . . 68d are formed in the outer ends of the arms. The holes 68a, 68c and 68d are each circular, with the holes 68a and 68c somewhat larger than the hole 68d. The hole 68b is elongated, in the manner of a slot. The direction of elongation is along the line joining the centers of the holes 68b and 68d. The width of the hole 68b is the same as the diameter of the hole 68a. The centers of the holes 68b, 68c and 68d are at three of the four corners of a square, and the hole 68a is slightly offset from the fourth corner of the square.

A drop of adhesive material is applied to the top of the package on the alignment fixture 50 (the back surface of the ceramic chip carrier 10), and the registration aid is placed on top of the package with one of the posts 54 in the circular hole 68d and the other post in the slot-form hole 68b. The posts 54 are a slip fit in the holes 68b and 68d. The holes 68 of the registration aid are thereby located relative to the outer ends of the leads 34 with respect to translation perpendicular to the central axes of the posts 54 and rotation about axes parallel to the central axes of the posts. When the adhesive is cured, the registration aid and the attached integrated circuit package are removed from the alignment fixture, and the holes 68 of the registration aid are then in predetermined positions relative to the outer ends of the leads 34.

Figure 3:
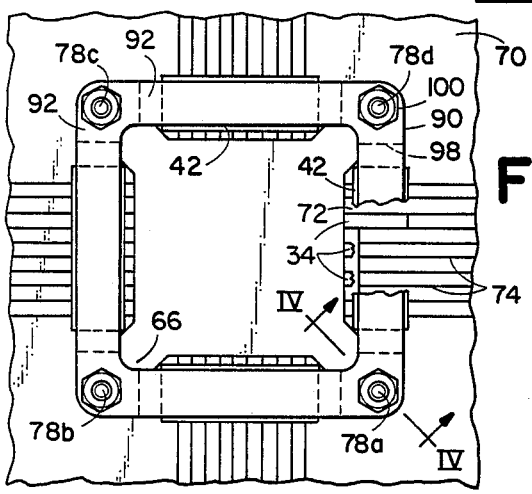
FIG. 3 is a plan view of a circuit board having an integrated circuit package, including the chip carrier, mounted thereto.

An etched circuit board 70 (FIG. 3) is formed with a rectangular hole 72 which is somewhat larger than the chip carrier 10 but is smaller than the opening defined by the sides of the lead frame. The circuit board has conductor runs which terminate in pads 74 which are distributed about the periphery of the rectangular hole 72. The circuit board is also formed with circular holes 76 which are in predetermined positions relative to the contact pads 74. The positions of the holes 76 relative to the contact pads 74 correspond to the positions of the holes 68 of the registration aid relative to the outer ends of the leads 34. Threaded posts 78a ... 78d are fitted in the holes 76 respectively. The four posts 78 are identical, and each has five main parts, i.e., a splined cylinder 80 which fits in the hole 76, a flange 82 which engages the upper surface of the circuit board, a cylinder 84 which projects above the upper surface of the circuit board, and threaded parts 86 and 88 which extend respectively above and below the circuit board when the splined cylinder is fitted in the hole 76. The cylinders 84 are of uniform height above the upper surface of the flange 82. The posts are secured in position by nuts 89 which are fitted on the threaded parts 88 respectively.

The composite structure of the IC package and registration aid is fitted to the circuit board with the package presented towards the hole 72 in the circuit board and the holes 68 in the arms 66 of the registration aid fitted over the upper cylinders 84 respectively. The cylinders 84 are sized for a slip fit in the holes 68b and 68d. Because the hole 68a is offset from the fourth corner of the square defined by the centers of the holes 68b, 68c and 68d, the hole containing the post 78a is similarly offset, and therefore the composite structure has only one possible position relative to the contact pads 74 such that the cylinders 84 each enter one of the holes 68. However, the holes 68a and 68c are sufficiently larger than the cylinders 84 that entry of the cylinders of the pins 78a and 78c in the holes 68a and 68c does not influence the position of the composite structure relative to the circuit board.

A clamping frame 90 made of rigid injection molded synthetic polymer material, for example the material sold under the trademark RYTON, has four sides 92 and is formed with a hole 94 at each corner. The size and spacing of the holes 94 is such that they will fit easily over the threaded parts 86 of the posts 78. Each side of the frame 90 is formed with a groove 96 at its underside. Four bodies 98 of injection molded elastomer material, each of which is T-shaped in cross-section, are bonded to the frame 90 with the bases of the T's in the grooves 96 respectively. The clamping frame 90 is fitted to the circuit board so that the posts 78 extend through the holes 94 respectively. In this position, the leads 34 and the tabs 42 lie between the upper surface of the circuit board and the bodies 98 of elastomer material, and are in registration with respective contact pads 74 of the circuit board. Nuts 100 are fitted to the threaded parts 86 of the posts 78, and upon tightening the nuts the frame 90 is clamped to the circuit board and the leads 34 are placed in electrically conductive pressure contact with the contact pads 74 respectively. The offset of the outer ends of the arms of the registration aid relative to the central portion thereof is such that the leads 34 and the upper surface of the circuit board are essentially coplanar and therefore the leads 34 provide a short and direct conduction path between the pads 74 of the circuit board and the pads 14 of the chip carrier.

Figure 4:
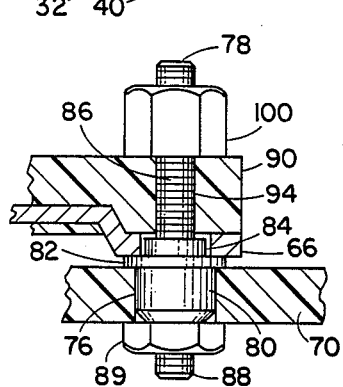
FIG. 4 is a section taken on the line IV—IV of FIG. 3.
Figure 2:
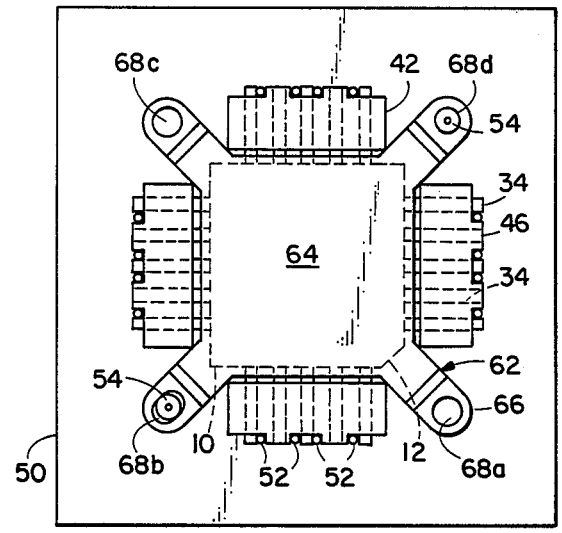
FIG. 2 is a plan view of an alignment fixture having the chip carrier fitted thereto after partial removal of the lead frame and the support frame, and also illustrates a registration aid.

As shown in FIG. 4, the upper cylinders 84 of the posts 78 are below the tops of the outer ends of the arms 66 of the registration aid. The arms 66, on top of the flanges 82, provide a positive stop with respect to movement of the frame 90 towards the circuit board, and therefore when the nuts 100 are tightened the elastomer material is compressed to a predetermined extent, preferably about 20%, and provides contact force for maintaining the leads 34 in pressure contact with the respective contact pads 74, and the registration aid is firmly clamped to the circuit board.

Figure 5:
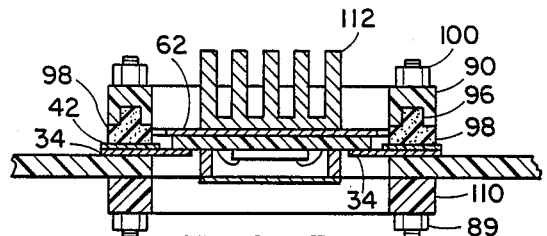
FIG. 5 is a sectional view of a modification of FIG. 3, FIG. 6, is a sectional view of a further modification of FIG. 3.

In a modification shown in FIG. 5, a stiffener frame 110 is secured to the underside of the board. The stiffener frame is similar to the frame 90 and is fitted over the threaded parts 88 of the posts 78 prior to application of the nuts 89. The stiffener frame 110 is particularly suited to cases in which the chip carrier, and consequently the hole in the circuit board, is more than about 2 cm square.

Heat is conducted from the chip through the substrate to the registration aid, and is transferred by convection from the registration aid to ambient air. In the event that the surface area of the registration aid is not sufficient by itself to remove heat sufficiently quickly, a convection heat sink 112 may be attached to the registration aid, as also shown in FIG. 5. The heat sink is attached to the registration aid using a thermally-conductive adhesive material.

Figure 6:
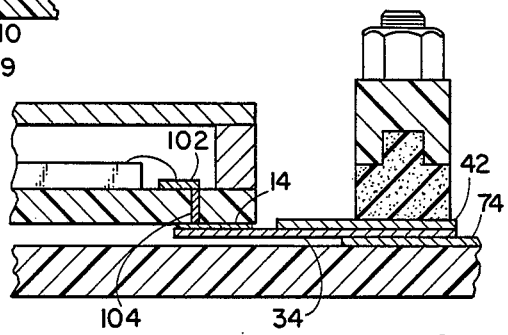

Ceramic chip carriers are available with their contact pads 14 on the opposite side of the substrate from the chip receiving area. The contact pads 14 are connected to conductor runs 102 (FIG. 6) which are on the same side of the carrier as the chip-receiving area by vias 104 formed in the chip carrier. By use of this type of chip carrier, and suitably offsetting the outer ends of the arms of the registration aid relative to the rectangular portion thereof, the leads can be brought into essentially coplanar relationship with the upper surface of the circuit board without any need for a hole in the circuit board to accommodate the IC package. An arrangement of this kind is particularly suited for chips having low power dissipation.

Figure 7:
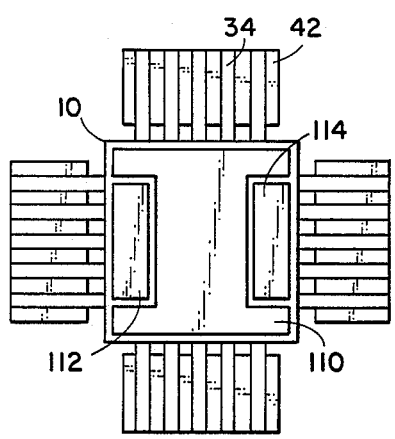
FIG. 7 is a bottom plan view of an integrated circuit package comprising a chip carrier and leads that have been cut from a lead frame.
Figure 8:
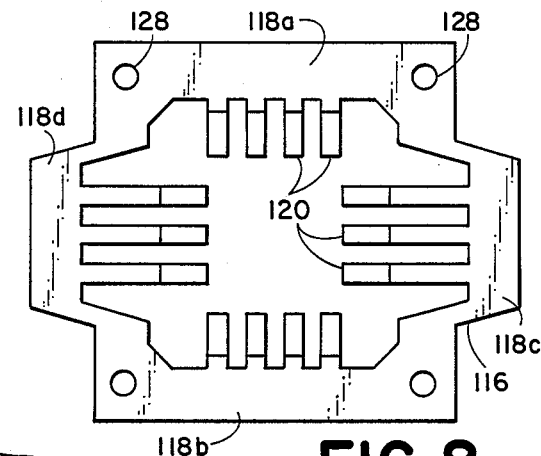
FIG. 8 is a plan view of a contact frame for use with the FIG. 7 package.
Figure 9:
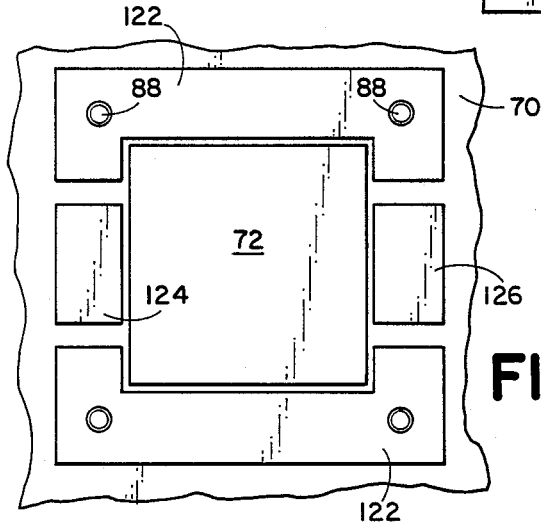
FIG. 9 is a bottom plan view of a circuit board for receiving the FIG. 7 package.
Figure 10:
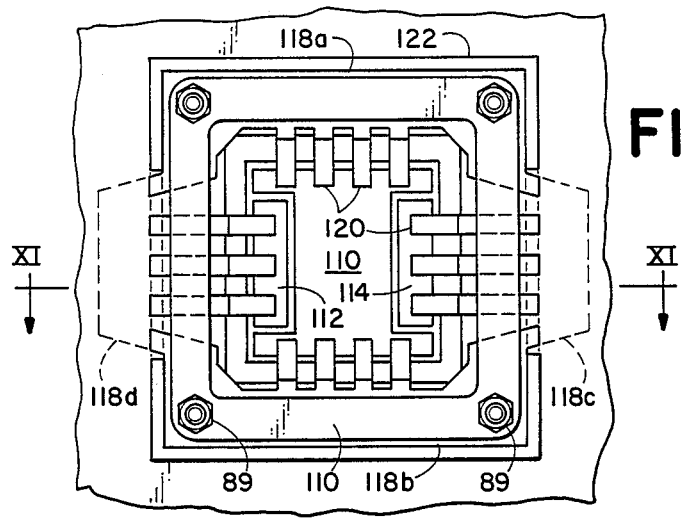
FIG. 10 is a bottom plan view of the circuit board of FIG. 9 with the contact frame and the integrated circuit package mounted thereto.

In a further development, a multilayer chip carrier is constructed so that all the signal line pads are distributed about the periphery of the upper surface of the ceramic substrate and the ground terminal 110 and the power supply terminals 112 and 114 are on the lower surface of the substrate, as shown in FIG. 7. In FIG. 7, the ground terminal 110 is a ground plane which occupies most of the lower surface of the substrate and the power supply terminals 112 and 114 are pads adjacent opposite respective sides of the lower surface of the substrate. A resilient contact frame 116 (FIG. 8) is made from gold-plated beryllium copper and is generally rectangular in form having four sides 118a ... 118d which bound a generally rectangular opening. Leads 120 extend from the sides 118 of the contact frame into the rectangular opening, and are bent at an angle of about 30 degrees out of the plane of the sides 118. The circuit board's ground and power supply contact pads 122, 124 and 126 are on the lower surface of the circuit board as shown in FIG. 9 and are provided a light coat of solder creme with flux. The contact frame is formed with holes 128 for receiving the threaded parts 88 of the posts 78. The contact frame is applied to the bottom surface of the circuit board in a manner such that the leads 120 are directed upwards into the hole in the circuit board and the threaded parts 88 of the posts 78 extend through the holes 128 respectively. The stiffener frame 110 is then applied to the posts 78 and is secured in position using the nuts 89. The sides 118a and 118b of the contact frame 116 lie under the corresponding sides of the stiffener frame 110, but the contact frame is dimensioned so that the other two sides 118c and 118d are beyond the outer periphery of the stiffener frame. The circuit board, with the contact frame and the stiffener frame attached thereto, is subjected to a vapor phase solder operation, and the contact frame is thereby metallurgically bonded to the ground and power supply contact pads. However, the sides 118c and 118d, which lie beyond the outer periphery of the stiffener frame, also lie beyond the power supply contact pads 124 and 126 and therefore are not bonded directly to the circuit board. These sides 118c and 118d are folded away from the circuit board and are broken from the other sides 118a and 118b and from the leads which formerly projected from the sides 118c and 118d and are now clamped between the stiffener frame and the circuit board. In this manner, the leads which projected from the sides 118c and 118d become electrically separated from each other and from the leads projecting from the sides 118a and 118b.

Figure 11:
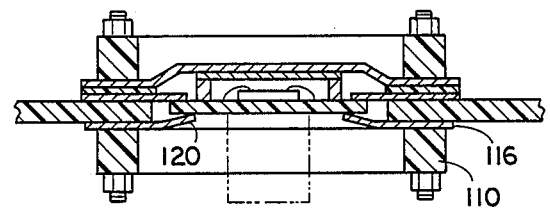
FIG. 11 is a section on the line XI—XI of FIG. 10.

The composite structure of the registration aid and the IC package is presented to the upper surface of the circuit board, in the manner described previously, and the resilience of the leads 120 ensures that there is good electrical contact between the ground and power supply contact pads of the circuit board and the ground and power supply terminals of the substrate. In the case of this embodiment, the registration aid is attached to the top of the lid of the IC package instead of to the bottom of the substrate. A convection heat sink may be attached to the bottom surface of the substrate, as shown in broken lines in FIG. 11. Of course, care must be taken to ensure that the heat sink does not short circuit either of the power supply terminals 112 and 114 to ground.

Figure 12:
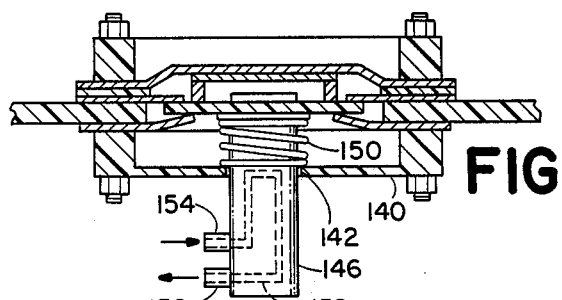
FIG. 12 is a view similar to FIG. 11 illustrating a modified heat sink arrangement.

In a modification of the arrangement shown in FIGS. 7-11, the stiffener frame 110 has a bottom plate 140 (FIG. 12) which is formed with an aperture 142. A metal plunger 146 is fitted in the aperture 142, and a compression spring 150 urges the upper end of the plunger into contact with the chip carrier. Thermal grease on the upper end of the plunger ensures a good thermally conductive contact between the chip carrier and the plunger 146. The plunger is formed with a conduit 152, and cooling water is circulated through this conduit by way of flow and return connections 154, 156 for removing heat from the chip carrier. In this arrangement, the chip carrier can be removed from the circuit board without its being necessary to remove the heat sink components from the circuit board.

Figure 15:
FIG. 15 is a partial sectional view taken on the line XV—XV of FIG. 14.
Figure 14:
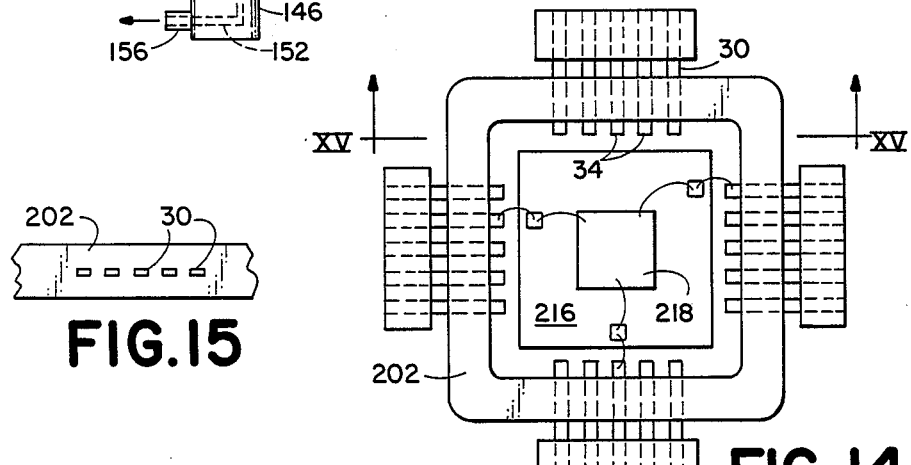
FIG. 14 is a plan view of the integrated circuit package shown in FIG. 13.
Figure 13:
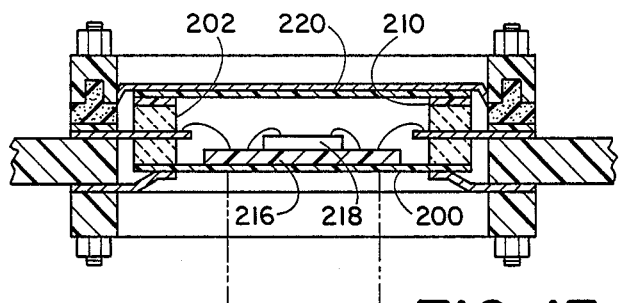
FIG. 13 is a sectional view illustrating an integrated circuit package mounted to a circuit board.

The invention is not restricted to use of a chip carrier of the kind illustrated in FIGS. 1-12. For example, as shown in FIGS. 13-15, an integrated circuit chip may be mounted in an enclosure comprising a base plate 200 and a wall structure 202 made of dielectric material such as glass or ceramic. A metal lead frame 30 is embedded in the wall structure. A seal ring 210 is placed on top of the wall structure. A substrate 216 having one or more integrated circuit chips 218 mounted thereon is fitted in the enclosure and is bonded to the base plate 200. The substrate has contact pads which are connected to the inner ends of the leads 34 by wire bonding. The enclosure is sealed by means of a lid 220 which is attached to the seal ring 210. The developments described with reference to FIGS. 7-12 are applicable to this type of package also. The base plate 200 may be made of metal, but in this case only the ground connection is available on the lower surface of the package. The wall structure may be made of synthetic polymer material, such as the material known as PPS (polyphenyl sulfide), in which case a seal of epoxy adhesive material might be used instead of the seal ring 210.

Figure 16:
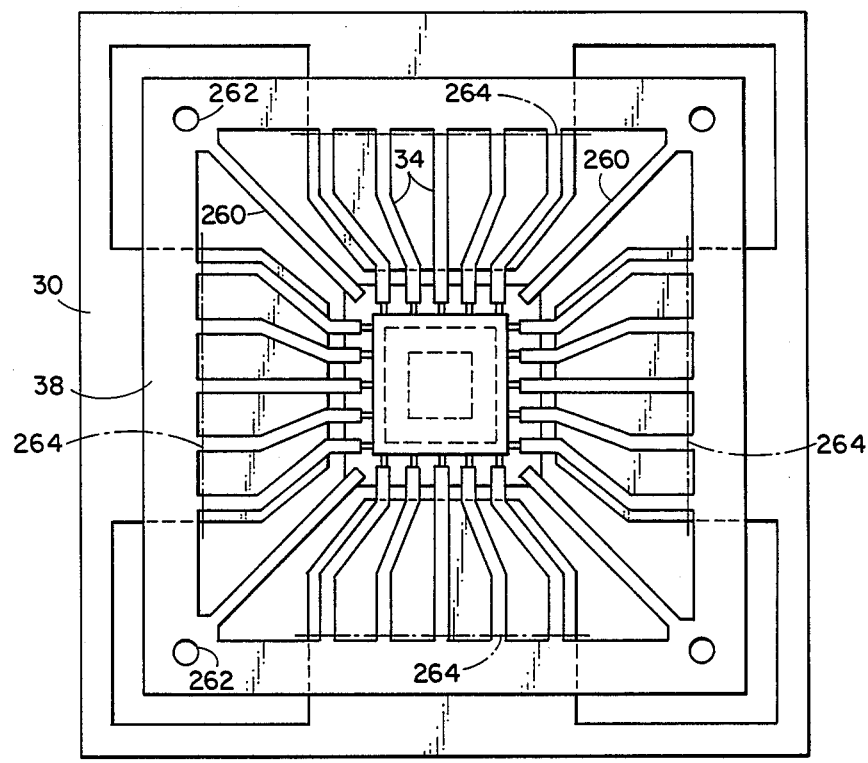
FIG. 16 is a plan view of a ceramic chip carrier having a modified lead frame attached thereto and also having a support frame attached to the lead frame.
Figure 17:
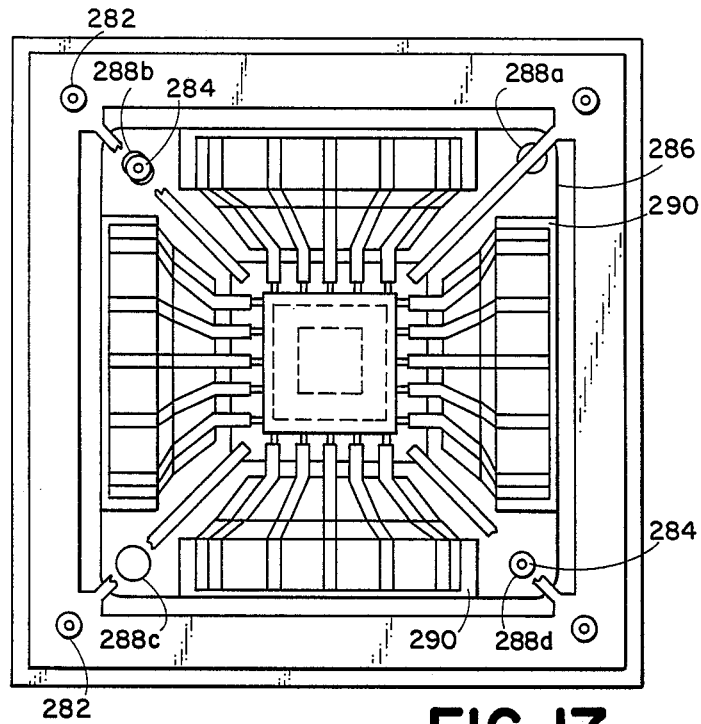
FIG. 17 illustrates the structure of FIG. 16 when mounted to an alignment fixture, with the lead frame and the support frame cut to separate the leads from other parts of the lead frame.
Figure 18:
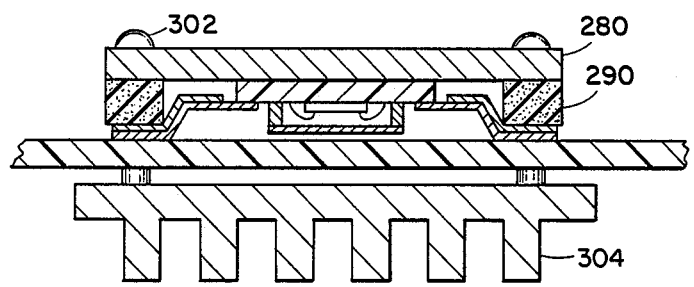
FIG. 18 is a sectional view of the integrated circuit package of FIG. 17 when mounted to a circuit board.
Figure 19:
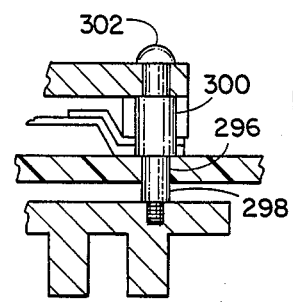
FIG. 19 is a sectional view of a feature of FIG. 18.

FIG. 16 illustrates a further modification of the arrangement described with reference to FIGS. 1-12. In the case of FIG. 16, the lead frame 30 includes registration tabs 260 which extend diagonally from the corners of the lead frame and are attached to respective corners of the chip carrier. At the outer end of each registration tab 260, the lead frame is formed with a registration hole 262. The holes 262 are in predetermined positions relative to the inner ends of the leads. The lead frame support 30 is bonded to the lower side of the lead frame 38, and the lead frame and the support are cut along the dot-dash line 264. The leads are thereby separated from the sides 40 of the frame and from the registration tabs 260. The leads 34 are bent out of the plane of the sides of the frame. An alignment fixture comprises a flat plate 280 having a group of four posts 282 projecting from its upper surface in a rectangular array, and an additional pair of pins 284. A generally rectangular registration aid 286, which also functions as a heat sink, has holes 288a ... 288d at its four corners. The holes 288a, 288c and 288d are circular and the hole 288b is an elongate, slot-form hole. The holes 288a and 288c are somewhat larger in diameter than the hole 288d. The direction of elongation of the slot-form hole 288b is along the line from the center of that hole to the center of the diagonally-opposite hole 288d. The width of the slot-form hole 288b is equal to the diameter of the circular hole 288d. The centers of the holes 288b 288c and 288d are at three of the four corners of a square, and the center of the hole 288a is slightly offset from the fourth corner of the square.

The registration aid 286 has four bodies 290 of elastomer secured to one surface adjacent the four sides respectively. The registration aid is applied to the upper surface of the alignment fixture so that the two pins 284 extend through the holes 288b and 288d respectively. The pins are slip fits in the holes, and therefore the registration aid is held against movement relative to the alignment fixture in directions perpendicular to the central axes of the pins. The assembly of the chip carrier and the lead frame is fitted to the alignment fixture over the registration aid 286 and the registration holes 262 of the lead frame are fitted over the posts 282 respectively. The bent leads then extend over the elastomer bodies 290. Known techniques are used to ensure that the chip carrier and lead frame assembly is fitted to the alignment fixture in the correct position relative to the registration aid. Adhesive material is used to secure the chip carrier to the registration aid 286. When the adhesive is cured, the registration tabs 260 are cut close to the corners of the chip carrier. The outer ends of the leads are accurately positioned relative to the holes 288 in the registration aid 286.

The circuit board is formed with four holes 296 which receive respective alignment bushings. The holes 296 are all the same size, and the relative positions of the holes 296 correspond to the relative positions of the centers of the holes 288. Each bushing has a lower portion 298 which is received in the hole of the circuit board and an upper portion 300 which extends above the upper surface of the circuit board. The bushings are retained in the holes by soldering to the lower surface of the circuit board. The alignment bushings are identical, and the diameter of the upper portions of the bushing is selected so that the upper portions 300 are received with a slip fit in the holes 288b and 288d of the registration aid. The composite structure of the registration aid and the package is presented to the upper surface of the circuit board and is fitted so that the upper portions 300 of the bushings enter the holes in the registration aid.

There is only one position in which the registration aid can be fitted to the circuit board such that each bushing enters one of the holes of the registration aid.

The positions of the holes of the circuit board relative to the contact pads that are exposed on the upper surface of the circuit board are predetermined, and correspond to the positions of the holes in the registration aid relative to the outer ends of the leads 34. Thus, the leads 34 overlie the contact pads of the circuit board. Screws 302 are inserted into the bushings and project from the lower ends of the bushes, and enter threaded holes in a heat sink 304 which is positioned beneath the circuit board.

It will be appreciated that the present invention is not restricted to the particular embodiment that has been described and illustrated, and that variations may be made therein without departing from the scope of the invention as defined in the appended claims and equivalents thereof. For example, in a modification of the arrangement shown in FIGS. 13–15 the base plate of the package may be made of dielectric material, in which case the chip(s) 218 may be mounted directly on the base plate instead of on a separate ceramic substrate. In this case, the base plate may be provided with an integral heat sink. The invention is not restricted to the specific arrangements of chip carrier, seal ring and lid that are illustrated. For example, in a modification of the FIG. 1 arrangement the seal ring 20 and the lid are replaced by a single inverted cup-like member of synthetic polymer material which is fitted over chip and is bonded at its rim to the chip carrier. The FIGS. 8–11 arrangement is not restricted to the terminals on the lower surface of the substrate being ground and power supply terminals. In a modification of the FIG. 6 arrangement, the substrate extends beyond the periphery of the lid, and runs 102 extend under the seal ring, so that the vias 104 are located outside the enclosure containing the integrated circuit chip.

I claim:

1. A method of mounting a substrate structure having contact pads, to a circuit board which has contact pads exposed at one main face of the board and has posts projecting from the circuit board which are in predetermined positions relative to the contact pads of the circuit board, said method comprising the following steps, not necessarily in the order stated:
   providing the substraste structure with leads which are electrically connected to the contact pads of the substrate structure and project from the substrate structure,
   providing a registration element which has holes which are engageable with the posts projecting from the circuit board and, when so engaged, maintain the registration element against movement parallel to the general pane of the board,
   providing an alignment member having a generally flat surface from which registration posts project, the arrangement of the registration posts corresponding to the arrangement of the posts projecting from the circuit board,
   placing the substrate structure on the alignment member in a predetermined position relative to the registration posts,
   fitting the registration element to the alignment member in a position such that the registration posts of the alignment member enter the holes of the registration element,
   securing the substrate structure to the registration element,
   bringing the holes of the registration element into engagement with the posts projecting from the circuit board, so that the leds overlie the contact pads of the circuit board, and
   maintaining the leads in electrically conductive pressure contact with the contact pads of the circuit board.

2. A method of mounting a substrate structure having contact pads, to a circuit board which has contact pads exposed at one main face of the board and has registrastion features which are in predetermined positions relative to the contact pads of the circuit board, said circuit board being formed with a hole and has a pad of conductive material exposed at its face opposite said one main face and the substrate structure has a terminal exposed at a face thereof, said method comprising the following steps, not necessarily in the order stated:
   providing the substrate structure with leads which are electrically connected to the contact pads of the substrate structure and project from the substrate structure,
   providing a contact member which has a support portion and at least one lead extending from the support portion and also has registration features which are engageable with the registration features of the circuit board and, when so engaged, maintain the contact member against movement parallel to the general plane of the circuit board,
   providing a registration element which has registration features which are engageable with the registration features of the circuit board and, when so engaged, maintain the registration element against movmenet parallel to the general plane of the board,
   positioning the hole in the circuit board so that when the registration features of the registration element are in engagement with the registration features of the circuit board, the terminal of the substrate structure is exposed through the hole in the circuit board,
   attaching the substrate structure to the registration element so that the leads are in predetermined positions relative to the registration features of the registration element,
   bringing the registration features of the contact member into engagement with the registration features of the circuit board with the contact member at said opposite face of the circuit board, so that the lead of the contact member extends at least partially over the hole in the circuit board and engages the terminal of the substrate structure when the registration features of the registration element are engaged with the registration features of the circuit board,
   bringing the registration features of the registration element into engagement with the registration features of the circuit board, so that the leads overlie the contact pads of the circuit board, and
   maintaining the leads in electrically conductive pressure contact with the contact pads of the circuit board.

3. A method according to claim 2, wherein the circuit board has a second pad of conductive material exposed at its said opposite face, the substrate structure having a second terminal exposed at said face thereof, and the contact member has a second lead which extends from said support portion for electrically connecting the second pad of the circuit board and the second terminal of the substrate structure when the registration features of the contact member are brought into engagement with the registration features of the circuit board, and the method comprises separating the first and second leads from each other after attaching the contact member to the circuit board.

4. A method of mounting a substrate structure having contact pads, to a circuit board which has contact pads exposed at one main face of the board and has registration features which are in predetermined positions relative to the contact pads of the circuit board, said method comprising the following steps, not necessarily in the order stated:

providing a lead frame having sides which define an opening and also having leads which extend from the sides into the opening, said lead frame having registration features and the substrate structure being attached to a registration element using an alignment fixture having a first set of registration features which are engageable by the registration features of the lead frame and a second set of registration features which are engageable by registration features of the registration element, attaching the ends of the leads that are further from the sides of the lead frame to the substrate structure and electrically connecting the leads to the contact pads of the substrate structure, subsequently detaching the sides of the lead frame from the leads, providing a registration element which has registration features which are engageable with the registration features of the circuit board and, when so engaged, maintain the registration element against movement parallel to the general plane of the board, bringing the registration features of the lead frame into engagement with the first set of registration features of the alignment fixture and subsequently bringing the registration features of the registration element into engagement with the second set of registration features of the alignment fixture and attaching the registration element to the substrate structure, bringing the registration feature of the registration element into engagement with the registration features of the circuit board, so that the leads overlie the contact pads of the circuit board, and maintaining the leads in electrically conductive pressure contact with the contact pads of the circuit board.

5. A method according to claim 4, wherein the registration features of the lead frame are features of the leads and the method comprises detaching the sides of the lead frame from the leads and subsequently bringing the registration features of the lead frame into engagement with the first set of registration features of the alignment fixtures and attaching the registration element to the substrate structure.

6. A method according to claim 4, wherein the registration features of the lead frame are features of the sides of the lead frame and the method comprises bringing the registration features for the lead frame into engagement with the first set of registration features of the alignment fixture and attaching the registration element to the substrate structure and subsequently detaching the sides of the lead frame from the leads.

7. In combination:
a circuit board which has contact pads exposed at one main face of the board and registration features which are in predetermined positions relative to the contact pads of the circuit board, said circuit board being formed with a hole,
a substrate structure having contact pads and also having leads which are electrically connected to the contact pads of the substrate structure and project from the substrate structure, said substrate structure extending at least partially into the circuit board hole, said substrate structure having a face which is exposed to a face opposite the main face of the circuit board through the hole in the circuit board and also having a terminal exposed at said face, said circuit board having an additional contact pad which is exposed at said opposite face,
a contact member which is attached to the circuit board at said opposite main face and projects at least partially over the hole in the circuit board, the contact member providing electrical connection between said terminal of the substrate structure and said additional contact pad of the circuit board,
a registration element which has registration features and to which the substrate structure is attached with the leads in predetermined positions relative to the registration features of the registration element, the registration features of the registration element being in engagement with the registration features of the circuit board such that the registration element is maintained against movement parallel to the general plane of the board and the leads overlie the contact pads of the circuit board, and
clamp means maintaining the leads in electrically conductive pressure contact with the contact pads of the circuit board.

* * * * *